(12) United States Patent
Wang et al.

(10) Patent No.: US 11,758,076 B2
(45) Date of Patent: Sep. 12, 2023

(54) CLOCK GENERATOR DEVICE, IMAGE PROCESSING CHIP, AND CLOCK SIGNAL CALIBRATION METHOD

(71) Applicant: Sigmastar Technology Ltd., Xia'men (CN)

(72) Inventors: Wei-Ping Wang, Hsinchu County (TW); Hsiu-Hua Lin, Hsinchu County (TW); Yu-Hung Kuo, Hsinchu County (TW)

(73) Assignee: SIGMASTAR TECHNOLOGY LTD., Xia'men (CN)

( * ) Notice: Subject to any disclaimer, the term of this patent is extended or adjusted under 35 U.S.C. 154(b) by 49 days.

(21) Appl. No.: 17/533,144

(22) Filed: Nov. 23, 2021

(65) Prior Publication Data

US 2022/0224804 A1   Jul. 14, 2022

(30) Foreign Application Priority Data

Jan. 11, 2021 (CN) .......................... 202110032081.3

(51) Int. Cl.
*H04N 5/06* (2006.01)
*H03L 7/085* (2006.01)
*H03L 7/099* (2006.01)

(52) U.S. Cl.
CPC ............... *H04N 5/06* (2013.01); *H03L 7/085* (2013.01); *H03L 7/099* (2013.01)

(58) Field of Classification Search
CPC ........................................................ H04N 5/06
USPC ............................................................ 331/44
See application file for complete search history.

(56) References Cited

U.S. PATENT DOCUMENTS

| | | | | |
|---|---|---|---|---|
| 5,257,294 | A  * | 10/1993 | Pinto ..................... | H03L 7/0997 331/34 |
| 2014/0333346 | A1* | 11/2014 | Bae ....................... | H03L 7/0995 327/5 |
| 2017/0132966 | A1* | 5/2017 | Lim ....................... | G09G 5/008 |

* cited by examiner

*Primary Examiner* — Joseph Chang
(74) *Attorney, Agent, or Firm* — WPAT, P.C

(57) ABSTRACT

A clock generator device includes a detector circuit, a calibration circuit, and a free running oscillator. The detector circuit is configured to determine whether a reference clock signal is received from a transmission interface to output an enable signal. The calibration circuit is configured to generate a first signal in response to the enable signal and an output clock signal, and compare the first signal with a predetermined value to generate a calibration signal. The free running oscillator is configured to adjust a frequency of the output clock signal in response to the calibration signal.

12 Claims, 6 Drawing Sheets

CLOCK GENERATOR DEVICE, IMAGE PROCESSING CHIP, AND CLOCK SIGNAL CALIBRATION METHOD

BACKGROUND OF THE DISCLOSURE

1. Field of the Disclosure

The present disclosure relates to a clock generator device. More particularly, the present disclosure relates to a clock generator device capable of being applied to an image processing chip and a clock signal calibration method thereof.

2. Description of Related Art

An oscillator circuit may be employed to generate a system clock signal to provide timings required by a digital circuit. In practical applications, because of process variation, voltage variation, and/or temperature variation, an offset may exist in the frequency of the system clock signal. In order to calibrate such offset, an additional circuit is required to be employed to provide an accurate reference signal. As a result, hardware cost and/or power consumption increase, and thus requirement(s) of certain applications cannot be met.

SUMMARY

In some aspects, a clock generator device includes a detector circuit, a calibration circuit, and a free running oscillator. The detector circuit is configured to determine whether a reference clock signal is received from a transmission interface to output an enable signal. The calibration circuit is configured to generate a first signal in response to the enable signal and an output clock signal, and compare the first signal with a predetermined value to generate a calibration signal. The free running oscillator is configured to adjust a frequency of the output clock signal in response to the calibration signal.

In some aspects, an image processing chip includes a memory circuit, a transmission interface, and a clock generator device. The transmission interface is configured to transmit a reference clock signal and transmit a program code to be executed by a processor to the memory circuit during an initial phase. The clock generator device is configured to receive the reference clock signal from the transmission interface, and calibrate a frequency of an output clock signal in response to the reference clock signal.

In some aspects, a clock signal calibration method includes the following operations: determining whether a reference clock signal is received from a transmission interface to output an enable signal; generating a first signal in response to the enable signal and an output clock signal, and comparing the first signal with a predetermined value to generate a calibration signal; and adjusting a frequency of the output clock signal outputted from a free running oscillator in response to the calibration signal.

These and other objectives of the present disclosure will no doubt become obvious to those of ordinary skill in the art after reading the following detailed description that are illustrated in the various figures and drawings.

DETAILED DESCRIPTION

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with at least one circuit, and the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
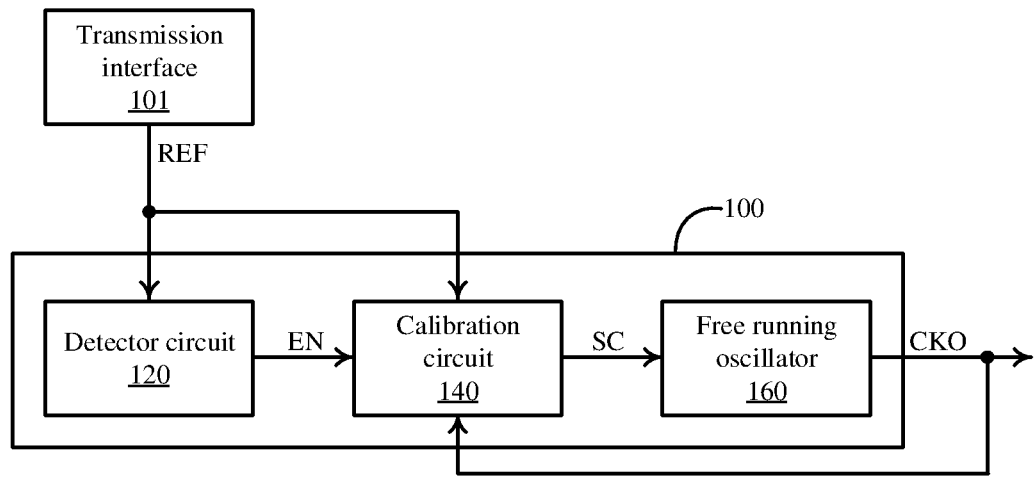
FIG. 1 is a schematic diagram of a clock generator device according to some embodiments of the present disclosure.

FIG. 1 is a schematic diagram of a clock generator device 100 according to some embodiments of the present disclosure. The clock generator device 100 includes a detector circuit 120, a calibration circuit 140, and a free running oscillator 160.

Figure 7:
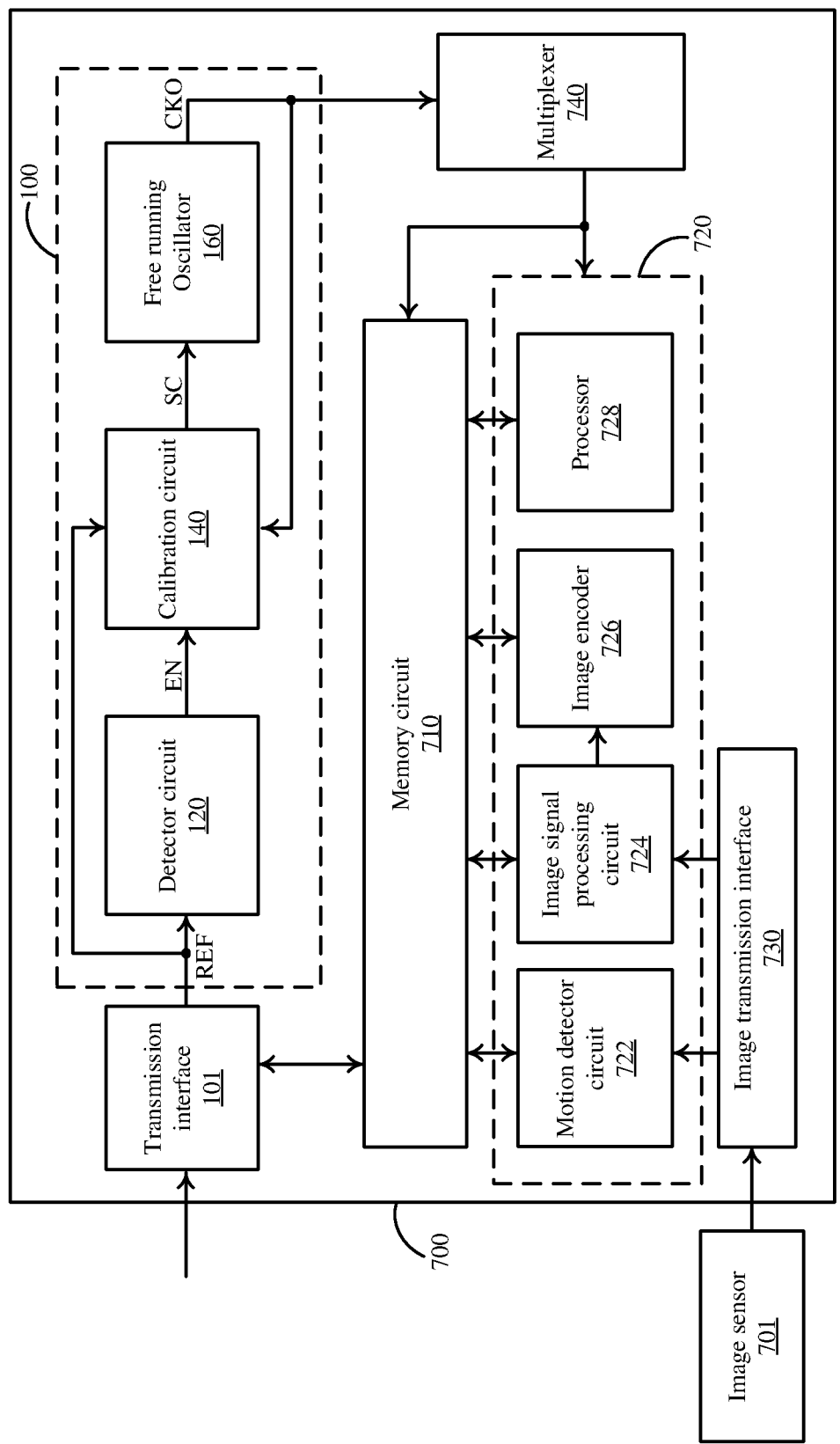
FIG. 7 is a schematic diagram of a surveillance chip according to some embodiments of the present disclosure.
Figure 8:
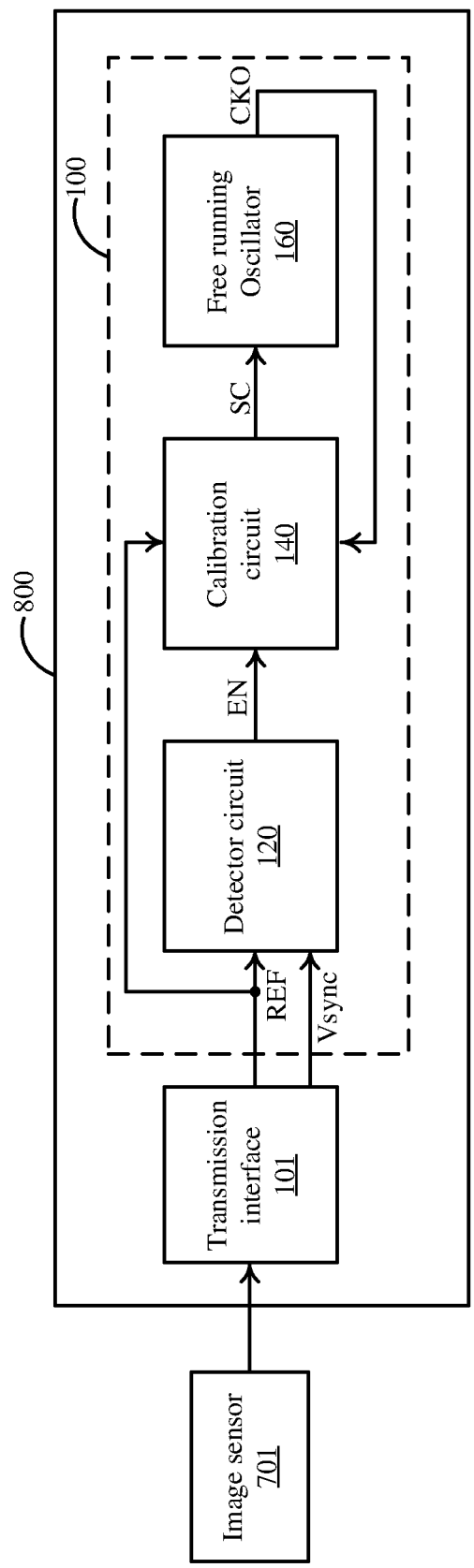
FIG. 8 is a schematic diagram of a chip according to some embodiments of the present disclosure.

The detector circuit 120 is coupled to a transmission interface 101 to receive a reference clock signal REF. The detector circuit 120 is configured to determine whether the reference clock signal REF is received from the transmission interface 101. In some embodiments, the reference clock signal REF may be an available clock signal in a current application environment. For example, as shown in FIG. 7, the reference clock signal REF may be a clock signal from a serial peripheral interface during an initial phase. Alternatively, as shown in FIG. 8, the reference clock signal REF may be a vertical synchronization signal Vsync. If the detector circuit 120 determines that the reference clock signal REF is received, the detector circuit 120 outputs an enable signal EN. The calibration circuit 140 is coupled to the detector circuit 120 to receive the enable signal EN. The calibration circuit 140 is configured to generate a first signal (e.g., a signal S1 in FIG. 3) in response to the enable signal EN and an output clock signal CKO, and compare the first signal with a predetermined value (e.g., a predetermined value PV in FIG. 3) to generate a calibration signal SC. The free running oscillator 160 is activated when the clock generator device 100 is powered to generate the output clock signal CKO. In some embodiments, the free running oscillator 160 is configured to adjust a frequency of the output clock signal CKO in response to the calibration signal SC.

In some related approaches, because of process, temperature, and/or temperature variations, an offset may exist in a frequency of an output clock signal of a free running oscillator circuit. In these approaches, it is required to employ an additional oscillator circuit to calibrate that frequency. As a result, the hardware cost increases. Compared with the above approaches, in some embodiments of the present disclosure, the detector circuit 120 and the calibration circuit 140 may utilize the available clock signal in the current application environment to calibrate the frequency of the output clock signal CKO without employing additional oscillator circuit(s). As a result, the hardware cost is reduced while the free running oscillator 160 can be calibrated.

Figure 2:
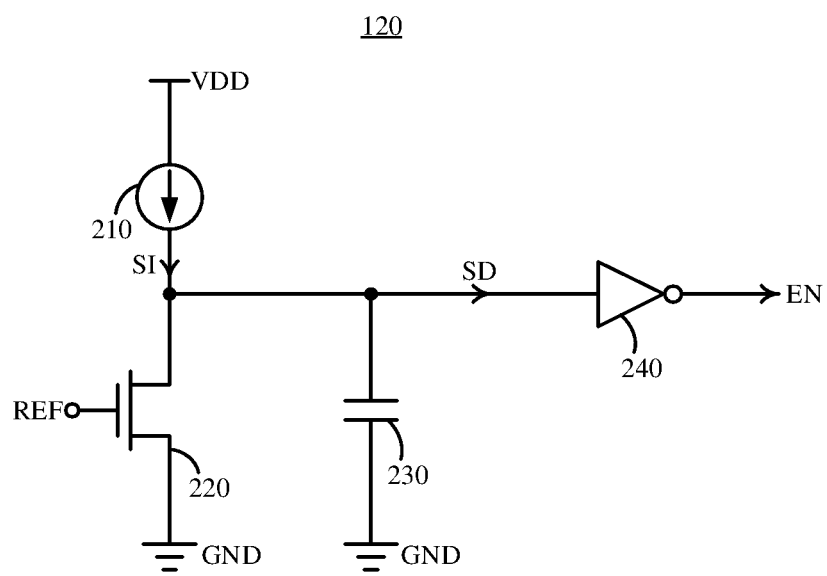
FIG. 2 is a schematic diagram of the detector circuit in FIG. 1 according to some embodiments of the present disclosure.

FIG. 2 is a schematic diagram of the detector circuit 120 in FIG. 1 according to some embodiments of the present disclosure. The detector circuit 120 includes a current source circuit 210, a switch 220, a capacitor 230, and an inverter circuit 240. A first terminal of the current source circuit 210 receives a voltage VDD, and a second terminal of the current source circuit 210 is coupled to a first terminal of the switch 220. A second terminal of the switch 220 receives a ground voltage GND, and a control terminal of the switch 220 receives the reference clock signal REF. A first terminal of the capacitor 230 is coupled to a second terminal of the current source circuit 210, and a second terminal of the capacitor 230 receives the ground voltage GND. An input terminal of the inverter circuit 240 is coupled to the first terminal of the capacitor 230, and an output terminal of the inverter circuit 240 is configured to output the enable signal EN. The current source circuit 210 is configured to provide a current signal SI. The switch 220 is configured to be selectively turned on according to the reference clock signal REF. The capacitor 230 is charged by the current signal SI and is discharged via the switch 220 to generate a detection signal SD. The inverter circuit 240 is configured to output the enable signal EN according to the detection signal SD.

In greater detail, when the detector circuit 120 does not receive the reference clock signal REF, it indicates that the reference clock signal REF is at a low level. Under this condition, the switch 220 is not turned on, and the capacitor 230 is charged by the current signal SI to generate the detection signal SD having a high level. In response to the detection signal SD, the inverter circuit 240 outputs the enable signal EN having the low level. Alternatively, when the detector circuit 120 receives the reference clock signal REF, it indicates that the reference clock signal REF has multiple pulses stably. The switch 220 may be sequentially turned on in response to these pulses to discharge the capacitor 230 to generate the detection signal SD having the low level. In response to the detection signal SD, the inverter circuit 240 outputs the enable signal EN having the high level. As a result, the level of the enable signal EN can indicate whether the reference clock signal REF is received.

The above arrangements of the detector circuit 120 are given for illustrative purposes, and the present disclosure is not limited thereto. The detector circuit 120 may be implemented with various circuits able to determine whether the reference clock signal REF is properly received, and thus those circuits are within the contemplated scope of the present disclosure.

Figure 3:
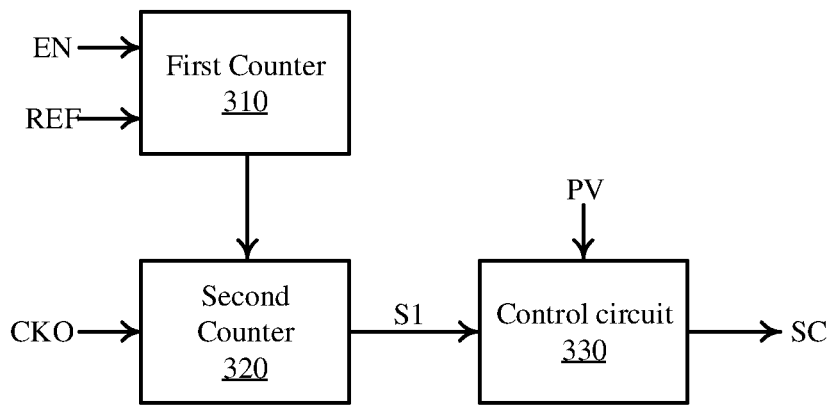
FIG. 3 is a schematic diagram of the calibration circuit in FIG. 1 according to some embodiments of the present disclosure.

FIG. 3 is a schematic diagram of the calibration circuit 140 in FIG. 1 according to some embodiments of the present disclosure. The calibration circuit 140 includes a first counter 310, a second counter 320, and a control circuit 330. The first counter 310 starts counting the reference clock signal REF in response to the enable signal EN, and stops counting when the counting operation meets a predetermined condition. In an embodiment, the predetermined condition may be a predetermined count value, and the first counter 310 may stop counting when the first counter 310 counts to the predetermined count value. In another embodiment, the predetermined condition may be a predetermined time, and the first counter 310 may stop counting when the counting period of the first counter 310 reaches to the predetermined time. The second counter 320 starts counting the output clock signal CKO in response to the start of the counting operation of the first counter 310, and stops counting in response to the end of the counting operation of the first counter 310, and generates the signal S1 correspondingly. In greater detail, when the enable signal EN has a predetermined level (e.g., a high level), the first counter 310 is triggered to start counting the reference clock signal REF until the predetermined condition is met. In response to the counting operation of the first counter 310, the second counter 320 also starts counting the output clock signal CKO for the same period to generate the signal S1. In other words, the counting operation of the second counter 320 is started with the counting operation of the first counter 310, and the counting period of the first counter 310 is the same as that of the second counter 320. The control circuit 330 is configured to compare the signal S1 with the predetermined value PV to output the calibration signal SC, in order to calibrate the output clock signal CKO generated from the free running oscillator 160. In some embodiments, the control circuit 330 may include a register circuit (not shown), which is configured to store the predetermined value PV. In some embodiments, the predetermined value PV may be a specific value or a specific range.

The arrangements about the calibration circuit 140 are given for illustrative purposes, and the present disclosure is not limited thereto. For example, in some other embodiments, the first counter 310 and the second counter 320 may be configured to be triggered by the enable signal EN to start counting.

Figure 4:
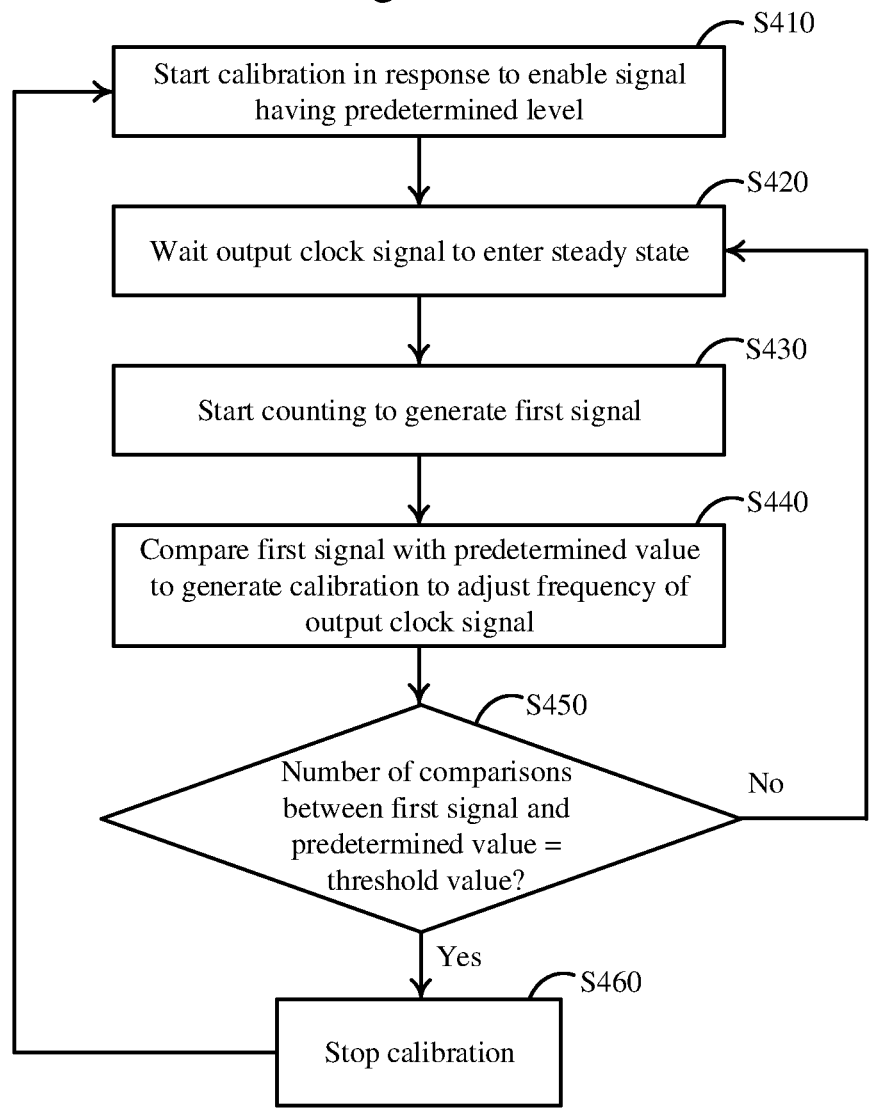
FIG. 4 is a flow chart of calibrating the free running oscillator according to some embodiments of the present disclosure.

FIG. 4 is a flow chart of calibrating the free running oscillator 160 according to some embodiments of the present disclosure. In some embodiments, operations in FIG. 4 may be implemented as a state machine, the control circuit 330 may be implemented with (but not limited to) one or more digital signal processing circuits that performs the state machine.

In operation S410, a calibration is started in response to the enable signal EN having a predetermined level (e.g., high level). In operation S420, the output clock signal (e.g., the output clock signal CKO in FIG. 1) is awaited to enter a steady state. In operation S430, the counting operation is started to generate the first signal (i.e., the signal S1 in FIG.

3). As mentioned above, if the enable signal EN has the high level, the first counter 310 is triggered to start counting the reference clock signal REF. In response to the counting operation of the first counter 310, the second counter 320 starts counting the output clock signal CKO as well to generate the signal S1.

In operation S440, the first signal is compared with the predetermined value (e.g., the predetermined value PV in FIG. 3) to generate the calibration signal (e.g., the calibration signal SC in FIG. 1) to adjust the frequency of the output clock signal. For example, if the signal S1 is higher than the predetermined value PV, it indicates that the current frequency of the output clock signal CKO is too high. Under this condition, the control circuit 330 may output a corresponding calibration signal SC to adjust a circuit setting of the free running oscillator 160 to decrease the frequency of the output clock signal CKO. Alternatively, the signal S1 is lower than the predetermined value PV, it indicates that the current frequency of the output clock signal CKO is too low. Under this condition, the control circuit 330 may output the corresponding calibration signal SC to adjust the circuit setting of the free running oscillator 160 to increase the frequency of the output clock signal CKO. When the signal S1 equals to the predetermined value PV, it indicates that the current frequency of the output clock signal CKO meets the requirement, and the control circuit 330 stops adjusting the calibration signal SC. In operation S450, whether a number of comparisons between the first signal and the predetermined value equals to a threshold value is determined. If the number of comparisons equals to the threshold value, operation S460 is performed. Alternatively, if the number of comparisons does not equal to the threshold value, operation S420 is performed again. For example, the threshold value may set to be (but not limited to) 7. If the number of comparisons equals to 7, the control circuit 330 may stop adjusting the frequency of the output clock signal CKO (i.e., operation S460), and wait to receive the enable signal EN having the predetermined value again (i.e., operation S410). Alternatively, if the number of comparisons is lower than 7, the control circuit 330 may continue adjusting the frequency of the output clock signal CKO (i.e., operations S420 to S440).

It is understood that the flow of the above operations is given for illustrative purposes, and the present disclosure is not limited thereto. Operations in FIG. 4 can be added, replaced, changed order, and/or eliminated, or the operations in FIG. 4 can be executed simultaneously or partially simultaneously as appropriate, in accordance with the spirit and scope of various embodiments of the present disclosure.

Figure 5:
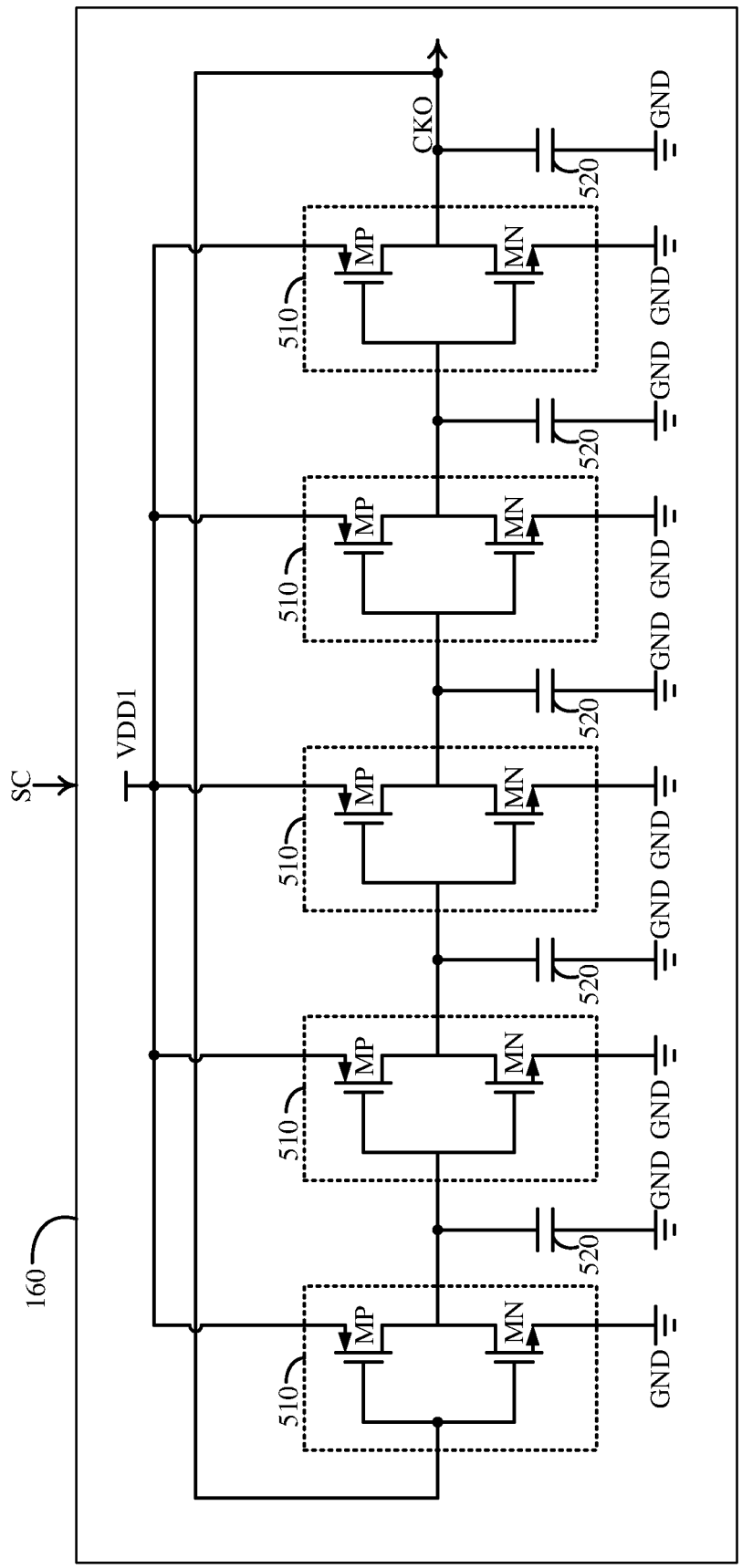
FIG. 5 is a schematic diagram of the free running oscillator in FIG. 1 according to some embodiments of the present disclosure.

FIG. 5 is a schematic diagram of the free running oscillator 160 in FIG. 1 according to some embodiments of the present disclosure. In some embodiments, the free running oscillator 160 includes inverter circuits 510 and capacitors 520. The inverter circuits 510 are coupled in series to form a ring oscillator circuit, and the capacitors 520 are respectively coupled to output terminals of the inverter circuits 510. Each inverter circuit 510 includes a transistor MP and a transistor MN. The transistor MP and the transistor MN are coupled in series and receive a voltage VDD1 and the ground voltage GND.

As mentioned above, the calibration signal SC in FIG. 1 can be utilized to adjust the circuit setting of the free running oscillator 160 to adjust the frequency of the output clock signal CKO. For example, in some embodiments, the calibration signal SC may be utilized to adjust a level of the voltage VDD1. For example, the voltage VDD1 is generated from a voltage regulator circuit (not shown). If the signal S1 is higher than the predetermined value PV, the control circuit 330 may output the corresponding calibration signal SC to the voltage regulator circuit to lower the level of the voltage VDD1. As a result, the driving ability of the inverter circuits 510 is decreased to lower the frequency of the output clock signal CKO. Alternatively, if the signal S1 is lower than the predetermined value PV, the control circuit 330 may output the corresponding calibration signal SC to the voltage regulator circuit, in order increase the level of the voltage VDD1. As a result, the driving ability of the inverter circuits 510 to increase the frequency of the output clock signal CKO.

In some other embodiments, the calibration signal SC may be configured to adjust a capacitance value of the capacitor 520. For example, the capacitor 520 may be implemented with a variable capacitor, and the capacitance value of the variable capacitor is controlled by the calibration signal SC. If the signal S1 is higher than the predetermined value PV, the control circuit 330 may output the corresponding calibration signal SC to increase the capacitance value of the capacitor 520. As a result, the frequency of the output clock signal CKO is decreased. Alternatively, if the signal S1 is lower than the predetermined value PV, the control circuit 330 may output the corresponding calibration signal SC to increase the capacitance value of the capacitor 520. As a result, the frequency of the output clock signal CKO may be decreased.

In some further embodiments, the calibration signal SC may be utilized to adjust the driving ability of the transistor MN and the transistor MP. Each of the transistor MN and the transistor MP may be implemented with multiple transistors (not shown) that are coupled in parallel with each other. If the number of transistors being coupled in parallel is more, the driving ability of the inverter circuit 510 is higher, and thus the frequency of the output clock signal CKO is higher. If the signal S1 is higher than the predetermined value PV, the control circuit 330 may output the corresponding calibration signal SC to decrease the number of transistors being coupled in parallel to lower the frequency of the output clock signal CKO. Alternatively, if the signal S1 is lower than the predetermined value PV, the control circuit 330 may output the corresponding calibration signal SC to increase the number of transistors being coupled in parallel to increase the frequency of the output clock signal CKO.

The arrangements about the free running oscillator 160 and the adjustments about circuit setting are given for illustrative purposes, and the present disclosure is not limited thereto. Various oscillator circuits able to adjust the frequency of the output clock signal CKO according to the control signal SC are within the contemplated scope of the present disclosure.

Figure 6:
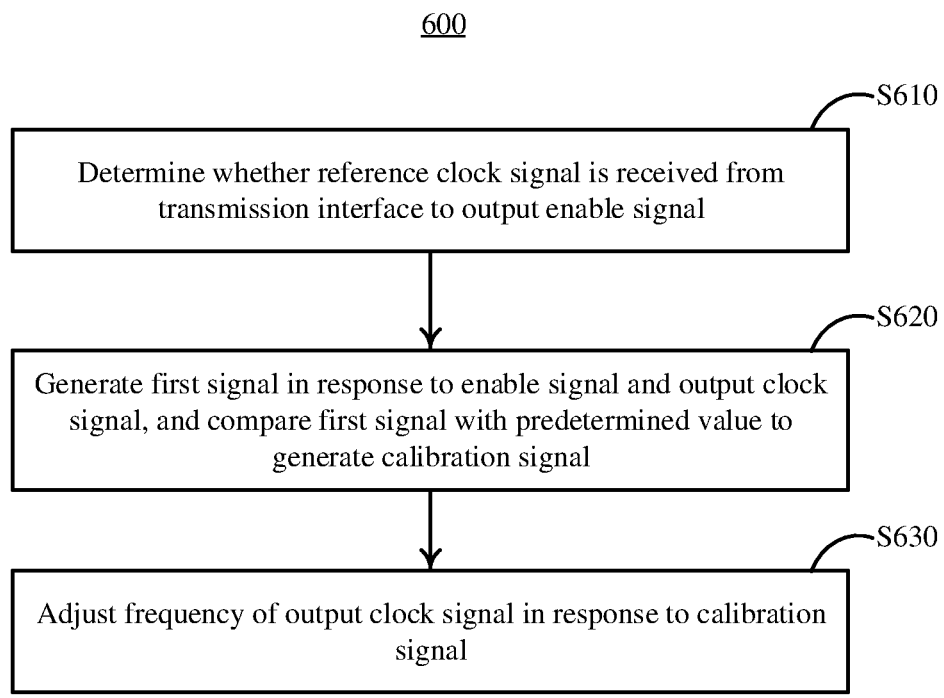
FIG. 6 is a flow chart of a clock signal calibration method according to some embodiments of the present disclosure.

FIG. 6 is a flow chart of a clock signal calibration method 600 according to some embodiments of the present disclosure. In operation S610, whether a reference clock signal is received from a transmission interface is determined to output an enable signal. In operation S620, a first signal is generated in response to the enable signal and an output clock signal, and the first signal is compared with a predetermined value to generate a calibration signal. In operation S630, a frequency of the output clock signal is adjusted in response to the calibration signal.

Operations S610 to S630 can be understood with reference to the above embodiments, and thus the repetitious descriptions are not further given. The above description of the clock signal calibration method 600 includes exemplary operations, but the operations of the clock signal calibration method 600 are not necessarily performed in the order described above. Operations of the clock signal calibration method 600 can be added, replaced, changed order, and/or eliminated, or the operations of clock signal calibration method 600 can be executed simultaneously or partially simultaneously as appropriate, in accordance with the spirit and scope of various embodiments of the present disclosure.

In some embodiments, the clock generator device 100 in FIG. 1 may be (but not limited to) applied to an image processing chip, which may include, for example, an image processing chip that is applied to observing or monitoring a predetermined scenario (also referred to as "surveillance chip"). FIG. 7 is a schematic diagram of a surveillance chip 700 according to some embodiments of the present disclosure.

The surveillance chip 700 includes the clock generator device 100, the transmission interface 101, a memory circuit 710, a circuitry 720, an image transmission interface 730, and a multiplexer 740. In this example, the transmission interface 101 may be (but not limited to) a serial peripheral interface. The memory circuit 710 may be (but not limited to) a static random-access memory (SRAM). In a normal operation, the output clock signal CKO provided by the clock generator device 100 is inputted to the memory circuit 710, the circuitry 720, and/or the image transmission interface 730 via the multiplexer 740 to provide needed operating timing. During an initial phase, the surveillance chip 700 may receive the reference clock signal REF via the transmission interface 101. The clock generator device 100 may receive the reference clock signal REF during the initial phase to calibrate the frequency of the output clock signal CKO. When the clock generator device 100 calibrates the frequency of the output clock signal CKO, the multiplexer 740 is controlled by the enable signal EN to output the reference clock signal REF to the memory circuit 710, the circuitry 720, and/or the image transmission interface 730 to provide needed operating timing. In other words, when the clock generator device 100 calibrates the output clock signal CKO, the memory circuit 710, the circuitry 720, and/or the image transmission interface 730 operate according to the reference clock signal REF. Moreover, during the initial phase, the memory circuit 710 may receive and store program code(s) to be executed by a circuit (e.g., the processor 728) in the circuitry 720 from the transmission interface 101. In the above embodiments, when the transmission interface 101 transmits the program code(s) to be executed by the processor 728, the clock generator device 100 utilizes the reference clock signal REF, which is transmitted at the same time when the transmission interface 101 transmits data, to calibrate the output clock signal CKO. As a result, the output clock signal CKO can be calibrated without employing an additional oscillator circuit.

In some embodiments, the circuitry 720 may receive image data from the image sensor 701 via the image transmission interface 730, and store the image data to the memory circuit 710. In some embodiments, the circuitry 720 may include (but not limited to) a motion detector circuit 722, an image signal processing circuit 724, an image encoder 726, and the processor 728. These components are to process image data to observe or monitor a predetermined area. The arrangements about the circuitry 720 are given for illustrative purposes, and the present disclosure is not limited thereto. Various image processors able to be employed in a video surveillance application are with the contemplated scope of the present disclosure.

FIG. 8 is a schematic diagram of a chip 800 according to some embodiments of the present disclosure. In some embodiments, the chip 800 may be (but not limited to) an image processing chip. In this example, the chip 800 includes the clock generator device 100 and the transmission interface 101, and the transmission interface 101 may be an image transmission interface, which may receive image data, a vertical synchronization signal Vsync, and the reference clock signal REF from the image sensor 701. In this example, the detector circuit 120 is further configured to determine whether the reference clock signal REF is received according to the vertical synchronization signal Vsync to output the enable signal EN. For example, the detector circuit 120 may determine whether a data synchronization interval is entered according to a polarity of the vertical synchronization signal Vsync. During the data synchronization interval, the image sensor 701 transmits the image data and a clock signal for synchronizing the image data (which may be employed as the reference clock signal REF). Accordingly, the detector circuit 120 may determine whether the reference clock signal REF is received according to the polarity of the vertical synchronization signal Vsync.

It is understood that, the output clock signal CKO may provide timings required by other circuits (not shown) in the chip 800. For example, the chip 800 may include an image processing circuit (e.g., the circuitry 720 in FIG. 7) and/or various types of digital circuits, and those circuits may operate according to the calibrated output clock signal CKO.

The above applications about the clock generator device 100 are given for illustrative purposes, and the present disclosure is not limited thereto. Various proper clock signals that are able to be acquired through external device(s) may be employed as the reference clock signal REF.

As described above, the clock generator device, the surveillance chip, and the clock signal calibration method in some embodiments of the present disclosure may utilize an available clock signal in the current application environment to calibrate the frequency of the free running oscillator circuit, without employing additional oscillator circuit(s). As a result, hardware cost is reduced while the system clock signal can be calibrated.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A clock generator device, comprising:
   a detector circuit determine whether a reference clock signal is received from a transmission interface to output an enable signal;
   a calibration circuit configured to generate a first signal in response to the enable signal, the reference clock signal, and an output clock signal, and compare the first signal with a predetermined value to generate a calibration signal; and
   a ring oscillator configured to adjust a frequency of the output clock signal in response to the calibration signal.

2. The clock generator device of claim 1, wherein the calibration circuit comprises:
   a first counter configured to count the reference clock signal according to a predetermined condition in response to the enable signal;
   a second counter configured to count the output clock signal to generate the first signal in response to a counting operation of the first counter; and
   a control circuit configured to compare the first signal with the predetermined value to output the calibration signal.

3. The clock generator device of claim 2, wherein when a number of comparisons between the first signal and the predetermined value equals to a threshold value, the control circuit is further configured to stop adjusting the frequency of the output clock signal.

4. The clock generator device of claim 1, wherein if the first signal is higher than the predetermined value, the ring oscillator is configured to decrease the frequency of the output clock signal in response to the calibration signal, and if the first signal is lower than the predetermined value, the ring oscillator is configured to increase the frequency of the output clock signal in response to the calibration signal.

5. The clock generator device of claim 1, wherein the transmission interface is a serial peripheral interface, and the detector circuit receives the reference clock signal when the serial peripheral interface transmits a program code.

6. The clock generator device of claim 1, wherein the transmission interface is an image transmission interface, and the detector circuit determines whether the reference clock signal is received according to a vertical synchronization signal from the image transmission interface.

7. The clock generator device of claim 1, wherein the detector circuit comprises:
   a current source circuit configured to provide a current signal;
   a switch configured to be selectively turned on according to the reference clock signal;
   a capacitor configured to be charged by the current signal and discharged via the switch to generate a detection signal; and
   an inverter circuit configured to output the enable signal according to the detection signal.

8. The clock generator device of claim 1, wherein the clock generator device is applied to an image processing chip, and when the ring oscillator adjusts the frequency of the output clock signal in response to the calibration signal, a circuit in the image processing chip operates according to the reference clock signal.

9. A clock signal calibration method, comprising:
   determining whether a reference clock signal is received from a transmission interface to output an enable signal;
   generating a first signal in response to the enable signal, the reference clock signal, and an output clock signal, and comparing the first signal with a predetermined value to generate a calibration signal; and
   adjusting a frequency of the output clock signal outputted from a ring oscillator in response to the calibration signal.

10. The clock signal calibration method of claim 9, wherein generating the first signal in response to the enable signal, the reference clock signal, and the output clock signal comprises:
    counting, by a first counter, the reference clock signal according to a predetermined condition in response to the enable signal; and
    counting, by a second counter, the output clock signal in response to a counting operation of the reference clock signal to generate the first signal.

11. The clock signal calibration method of claim 9, further comprising:
    if a number of comparisons between the first signal and the predetermined value equals to a threshold value, stopping adjusting the frequency of the output clock signal.

12. The clock signal calibration method of claim 9, wherein the transmission interface is a serial peripheral interface, and determining whether the reference clock signal is received from the transmission interface to output the enable signal comprises:
    receiving the reference clock signal when the serial peripheral interface transmits a program code.

* * * * *